United States Patent
Ishibashi et al.

(10) Patent No.: US 6,661,152 B2
(45) Date of Patent: Dec. 9, 2003

(54) DIAMOND SUBSTRATE FOR SURFACE ACOUSTIC WAVE DEVICE, AND SURFACE ACOUSTIC WAVE DEVICE

(75) Inventors: Keiji Ishibashi, Itami (JP); Takahiro Imai, Itami (JP); Tomoki Uemura, Itami (JP); Daichi Kawaguchi, Itami (JP); Hideaki Nakahata, Itami (JP); Satoshi Fujii, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 32 days.

(21) Appl. No.: 10/264,264

(22) Filed: Oct. 4, 2002

(65) Prior Publication Data

US 2003/0137217 A1 Jul. 24, 2003

(30) Foreign Application Priority Data

Oct. 5, 2001 (JP) ..................................... P2001-310370
Jan. 30, 2002 (JP) ..................................... P2002-022249

(51) Int. Cl.⁷ ................................................. H03H 9/25
(52) U.S. Cl. ................................................... 310/313 A
(58) Field of Search ....................................... 310/313 A (56) References Cited

U.S. PATENT DOCUMENTS

| | | | | | |
|---|---|---|---|---|---|
| 5,225,926 | A | * | 7/1993 | Cuomo et al. | 359/350 |
| 5,284,525 | A | * | 2/1994 | Saito et al. | 136/256 |
| 5,355,568 | A | * | 10/1994 | Imai et al. | 29/25.35 |
| 5,891,557 | A | * | 4/1999 | Shikata et al. | 428/216 |
| 6,153,315 | A | * | 11/2000 | Yamakoshi et al. | 428/687 |
| 6,299,425 | B1 | * | 10/2001 | Hirano et al. | 418/63 |
| 6,356,006 | B1 | * | 3/2002 | Fujii et al. | 310/313 R |
| 2001/0030795 | A1 | * | 10/2001 | Fujii et al. | 359/285 |
| 2001/0044029 | A1 | * | 11/2001 | Fujii et al. | 428/408 |

* cited by examiner

Primary Examiner—Thomas M. Dougherty
(74) Attorney, Agent, or Firm—McDermott, Will & Emery (57) ABSTRACT

A diamond film is deposited in the thickness of 20 $\mu$m on a silicon wafer 0.8 mm thick by filament CVD. Here the hydrogen content of the diamond film is adjusted in the range of not less than 1% nor more than 5% in atomic percent. By mechanical polishing with a grinding wheel including diamond abrasives, the diamond film is smoothed so that the arithmetic mean roughness (Ra) of the surface thereof becomes not more than 20 nm.

10 Claims, 5 Drawing Sheets

DIAMOND SUBSTRATE FOR SURFACE ACOUSTIC WAVE DEVICE, AND SURFACE ACOUSTIC WAVE DEVICE

BACKGROUND OF THE INVENTION

1. Field of the Invention

The present invention relates to a diamond substrate used for a surface acoustic wave (SAW) device applied to high-frequency filters or the like, and to a SAW device.

2. Related Background Art

With recent tendency toward higher frequencies in the communication field, there are growing demands for development of SAW devices applicable in the high frequency (e.g., 2.5 GHz) region. (A typical example of the SAW devices is a SAW device in which interdigital electrodes (IDT: Inter-Digital Transducers) are formed on a piezoelectric layer, a surface acoustic wave is oscillated in the piezoelectric or a medium except for the piezoelectric by action of the interdigital transducer and the piezoelectric, and the surface acoustic wave is detected by the interdigital transducer and the piezoelectric.) In order to substantiate the SAW devices applicable in the high frequency region, it is necessary to narrow the electrode spacing of the interdigital transducers, or to increase the propagation speed of the surface acoustic wave. Since the interdigital transducers are normally formed by photolithography, there is a limit to miniaturization thereof. It is thus necessary to realize a medium with high propagation speed of SAW.

Since diamond has the largest elastic modulus among all materials, the SAW propagation speed is high in the medium of diamond. The conventional SAW devices applicable in the high frequency region were thus those in which the piezoelectric layer was formed on a thin film of diamond as a medium of SAW and in which the interdigital transducers were further formed on the piezoelectric layer.

SUMMARY OF THE INVENTION

The conventional SAW devices using the thin diamond film, however, had the problem of increase in insertion loss, because the SAW propagation loss was large in the diamond film.

The diamond substrate for SAW device is desired to have the high propagation speed of SAW (preferably, 9000 m/s or higher), in order to enable use in the high frequency region.

The present invention has been accomplished in order to solve the above problem and an object of the invention is to provide a SAW device diamond substrate and a surface acoustic wave device with a diamond film realizing the high propagation speed and small propagation loss of SAW.

In order to achieve the above object, a SAW device diamond substrate according to the present invention is a diamond substrate for surface acoustic wave device comprising a substrate, and a diamond film formed on the substrate, wherein a hydrogen content of the diamond film is in the range of not less than 1% nor more than 5% in atomic percent and an arithmetic mean roughness (Ra) of a surface of the diamond film is not more than 20 nm.

When hydrogen is taken in during the forming process of the diamond film, hydrogen intervenes in the bond between carbons to lower the crystallinity of the diamond film. Particularly, when the hydrogen content is approximately 30%, the diamond film tends to become of amorphous structure like diamond-like carbon (DLC). As the hydrogen content of the diamond film increases, the SAW propagation speed becomes lower because of decrease of hardness (decrease of elastic modulus) of the diamond film.

As the hydrogen content of the diamond film decreases on the other hand, the surface acoustic wave is scattered more at grain boundaries because of high crystallinity in the diamond film, so as to increase the propagation loss.

The rougher the surface of the diamond film, the more the surface acoustic wave is scattered, to increase the propagation loss.

Inventor conducted elaborate research and found that the preferred propagation speed and propagation loss of SAW were simultaneously achieved under the conditions that the hydrogen content of the diamond film was in the range of not less than 1% nor more than 5% in atomic percent and the arithmetic mean roughness (Ra) of the surface of the diamond film was not more than 20 nm.

DESCRIPTION OF THE PREFERRED EMBODIMENTS

The following will detail, with reference to the accompanying drawings, the preferred embodiments of the SAW device diamond substrate of the present invention and the SAW device to which the SAW device diamond substrate is applied.

(First Embodiment)

Figure 1:
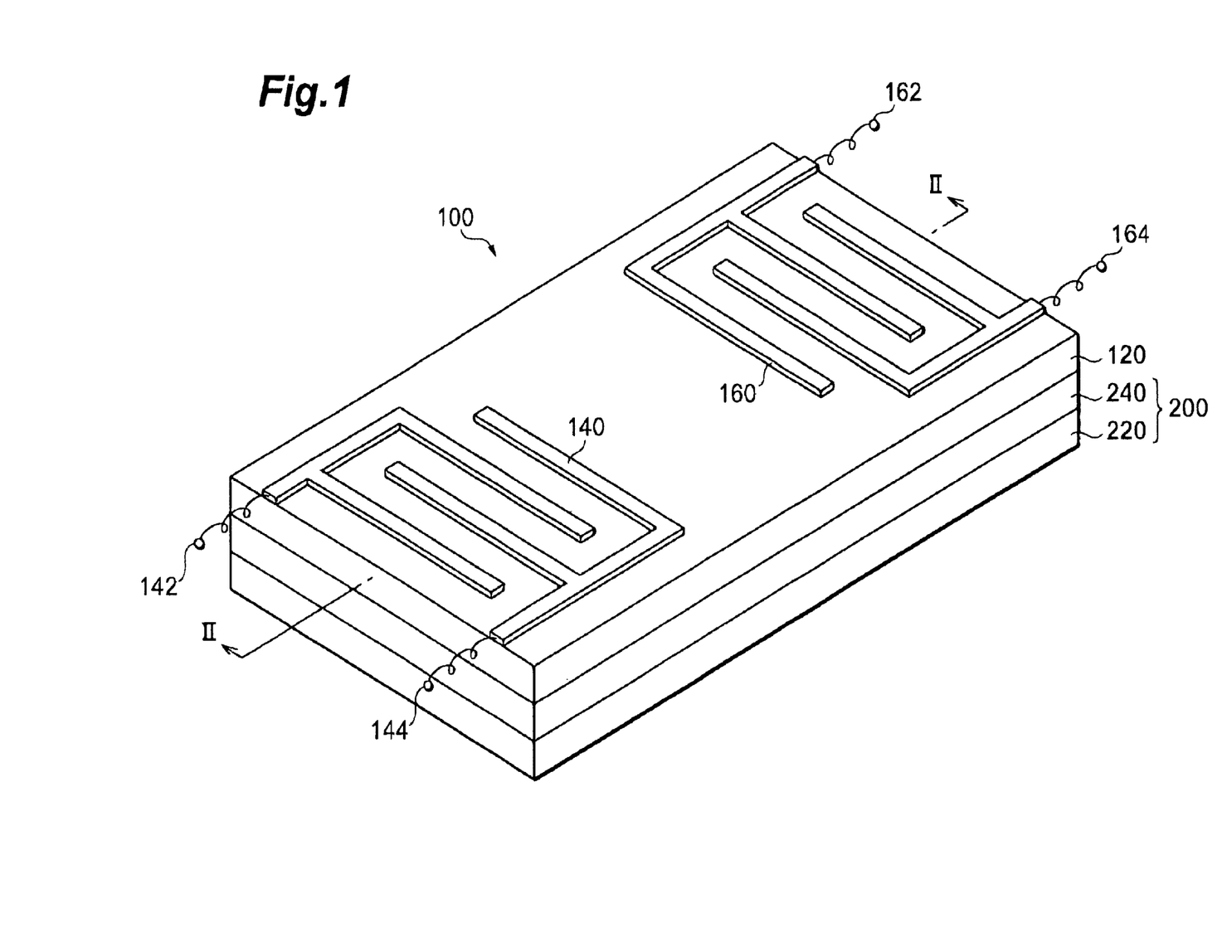
FIG. 1 is a schematic, perspective view of a SAW device 100 as an embodiment of the present intention.
Figure 2:
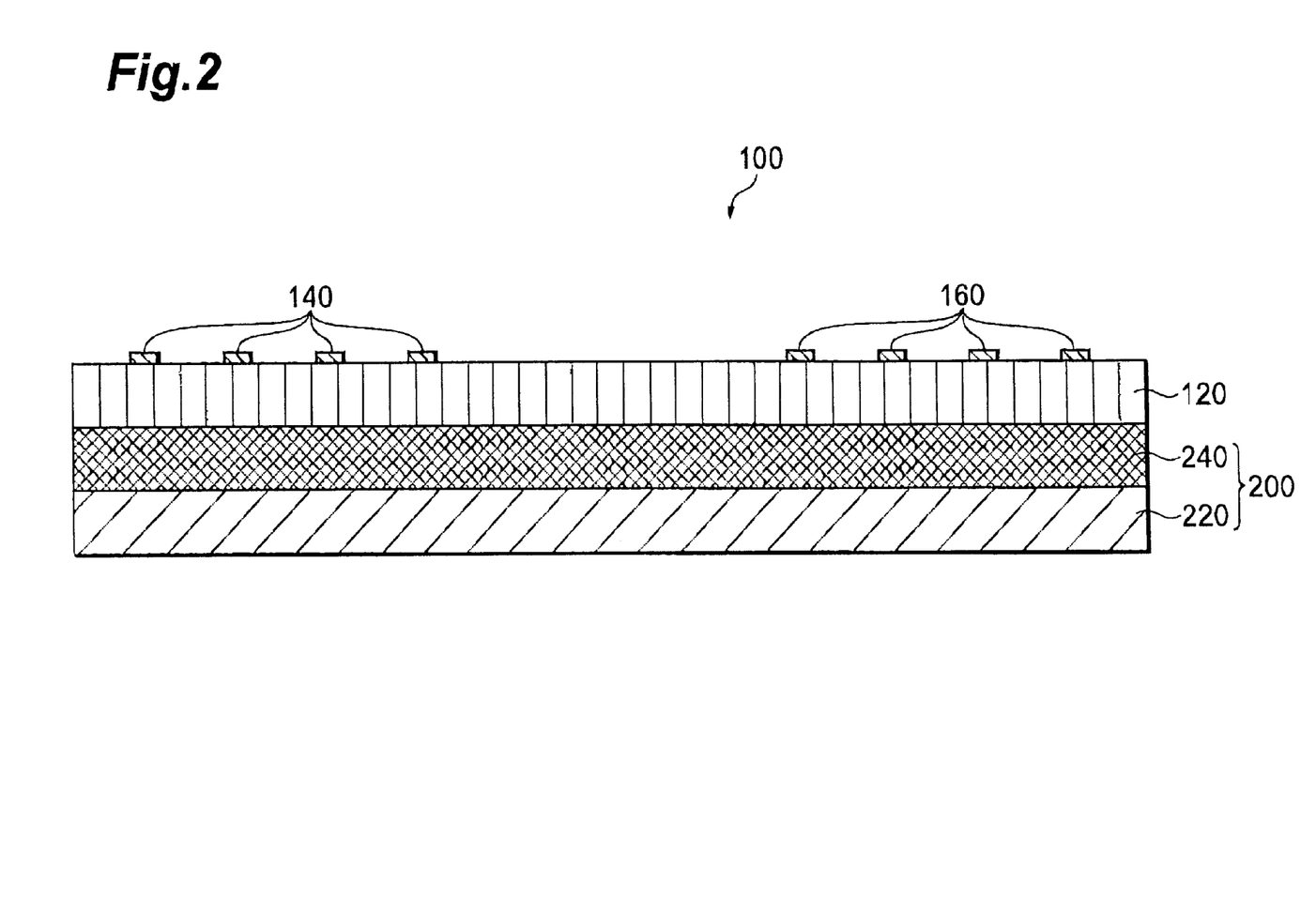
FIG. 2 is a sectional view along a line II—II of the SAW device 100 shown in FIG. 1.

FIG. 1 is a schematic, perspective view of the SAW device 100 of the present embodiment. FIG. 2 is a sectional view along a line II—II of the SAW device 100 shown in FIG. 1.

The SAW device 100 is composed of a diamond substrate 200 of the present embodiment, a piezoelectric film 120 formed on the diamond substrate 200 (an intermediate layer may also be formed between the diamond substrate 200 and the piezoelectric film 120), and an interdigital transducer 140 and an interdigital transducer 160 formed on the piezoelectric film 120. The diamond substrate 200 is comprised of a silicon wafer 220 and a diamond film 240.

The diamond film 240 is formed on the surface of the silicon wafer 220 by CVD (chemical vapor deposition), hot-filament CVD, microwave plasma CVD, high-frequency plasma CVD, the DC plasma jet method, or the like. During the deposition of the film, the hydrogen content of the diamond film 240 is adjusted so as to fall in the range of not less than 1% nor more than 5% in atomic percent.

The surface of the diamond film 240 thus deposited is smoothed by polishing so that the arithmetic mean roughness (Ra) thereof becomes not more than 20 nm (more preferably, not more than 10 nm). The polishing can be mechanical polishing by means of a grinding wheel including abrasive grains of diamond. The smoothing by polishing may be replaced by a method of micronizing grain sizes of crystals into the nanometer order during the deposition of the diamond film 240 so that the arithmetic mean roughness (Ra) becomes not more than 20 nm (more preferably, not more than 10 nm). In order to decrease the roughness of the surface by polishing, the grinding wheel is preferably one in which the distance is small between the surface of the bond and the tip of the diamond abrasives and in which the diamond abrasives have a large area of a flat region at the distal end.

Preferably, the diamond film 240 satisfies the following conditions (1) to (4).

(1) The spectrum in Raman spectroscopy has a peak near the wave number of 1333 cm$^{-1}$ and the peak has the half width of not less than 10 cm$^{-1}$.

(2) The Knoop hardness measured under the load of 500 g is in the range of not less than 6000 kgf/mm$^2$ nor more than 8500 kgf/mm$^2$.

(3) The average grain size of diamond crystals is not more than 1 μm.

(4) A ratio $I_{(220)}/I_T$, which is a ratio of a peak intensity $I_{(220)}$ of the diamond crystal plane (220) to the total $I_T$ of peak intensities of the diamond crystal planes (111), (220), (311), (400), and (331) by X-ray diffraction, is not less than 0.6.

The piezoelectric film 120 is formed on the surface of the diamond substrate 200 formed as described above, by CVD, microwave plasma CVD, PVD (physical vapor deposition), sputtering, ion plating, laser ablation, or the like. The piezoelectric can be one selected from AlN, ZnO, LiNbO$_3$, LiTaO$_3$, KNbO$_3$, PZT (PbZr$_x$Ti$_{(1-x)}$O$_3$), and so on.

The interdigital transducers 140 and 160 are formed on the surface of the piezoelectric film 120. The interdigital transducer 140 has an input terminal 142 and an input terminal 144, while the interdigital transducer 160 has an output terminal 162 and an output terminal 164.

The SAW device of the present embodiment realizes the high propagation speed of the second-order Sezawa wave of 9000 m/s. The propagation speeds of quartz and LN used heretofore as SAW media are approximately 3900 m/s and 4700 m/s, respectively, whereas the propagation speed of 9000 m/s or higher is only one achieved by diamond with high elastic modulus. The diamond substrate of the present embodiment has the propagation loss of not more than 0.02 dB/λ when applied to the 2.5 GHz SAW device, and the propagation loss of not more than 0.05 dB/λ when applied to the 5 GHz SAW device. The present invention first realized such high propagation speed and small propagation losses, and this diamond substrate allows actualization of high-frequency devices with low loss.

The insertion loss of the SAW device includes the resistance loss at the electrodes, the loss due to bi-directional spread of SAW, the loss due to reflection at the electrodes, the propagation loss, etc., and the present invention decreases the insertion loss of the SAW device on the basis of the decrease of propagation loss of the diamond substrate.

The SAW devices were fabricated with different distances between the input and output electrodes (the SAW devices with the respective distances between the input and output electrodes equivalent to 50 waves, 100 waves, and 150 waves), and were evaluated as to the relation between insertion loss and propagation distance (the distance between the input and output electrodes). A linear relation was obtained between them. A propagation loss per wave was obtained from the slope of the straight line.

The material of the substrate on which the diamond film is formed, is not limited to Si, but may be one selected from ceramics and metals such as GaAs, SiC, AlN, InP, Si$_3$N$_4$, Mo, and so on.

EXAMPLES

The present invention will be described below in further detail with examples and comparative examples thereof, but it is noted that the present invention is by no means intended to be limited to these examples.

Example 1

The diamond film 240 was formed in the thickness of 20 μm on the silicon wafer 220 0.8 mm thick, by filament CVD. A W wire was used as a filament. The temperature of the filament was controlled around 2100° C., and the temperature of the silicon wafer 220 around 800° C.

The diamond substrate 200 obtained as described above was fixed to a metal holder, and thereafter the diamond film 240 was smoothed by mechanical polishing with the grinding wheel including the diamond abrasives. The grinding wheel used herein was one in which the average diameter of abrasives was 20 μm, the distance was 2 μm between the surface of the bond and the tip of the diamond abrasives, and the maximum length of flat regions at the distal end of the abrasives was 6 μm. The polishing conditions were that the number of rotation of the grinding wheel was 200 rpm, the number of rotation of the holder was 200 rpm, and the load was 4 kg. Table 1 presents the deposition conditions of the diamond film 240.

A ZnO film (piezoelectric film 120) was then deposited in the thickness of 500 nm on the diamond film 240 after polished, by RF sputtering.

An Al film was then formed in the thickness of 80 nm on the ZnO film by DC sputtering. Unnecessary portions were removed from the Al film by photolithography to form the interdigital transducers 140 and 160. On the assumption that the wavelength of SAW λ=4 μm, the interdigital transducers were constructed in the structure wherein the electrode width of the interdigital transducers 140 and 160 was 1 μm, the electrode cross width 50 times the wavelength λ, and the number of electrode digit pairs 40.

Table 1 provides the results of the hydrogen content of the diamond film 240, the arithmetic mean roughness (Ra) of the surface thereof, and the propagation loss and propagation speed of SAW for each of examples and comparative examples. The hydrogen contents were determined by the method reported in JAPANESE JOURNAL OF APPLIED PHYSICS, VOL 23, No. 7, PP810–814, from absorption peaks of CH$_n$ near 3000 cm$^{-1}$ in infrared absorption analysis. The arithmetic mean roughness (Ra) of the surface was determined by means of am atomic force microscope (AFM).

TABLE 1

|  | H$_2$ FLOW sccm | CH$_4$ FLOW sccm | PRESSURE torr | HYDROGEN CONTENT at % | ARITHMETIC MEAN ROUGHNESS (Ra) nm | PROPAGATION LOSS dB/λ | PROPAGATION SPEED m/s |
|---|---|---|---|---|---|---|---|
| EXAMPLE 1-1 | 1500 | 35 | 20 | 1.0 | 20 | 0.020 | 9600 |
| EXAMPLE 1-2 | 1500 | 50 | 30 | 3.0 | 18 | 0.020 | 9500 |
| EXAMPLE 1-3 | 1500 | 65 | 30 | 5.0 | 15 | 0.018 | 9200 |
| COMPARATIVE EXAMPLE 1-1 | 1500 | 30 | 50 | 0.3 | 20 | 0.030 | 9900 |

TABLE 1-continued

| | H$_2$ FLOW sccm | CH$_4$ FLOW sccm | PRESSURE torr | HYDROGEN CONTENT at % | ARITHMETIC MEAN ROUGHNESS (Ra) nm | PROPAGATION LOSS dB/λ | PROPAGATION SPEED m/s |
|---|---|---|---|---|---|---|---|
| COMPARATIVE EXAMPLE 1-2 | 1500 | 40 | 30 | 1.2 | 25 | 0.035 | 9900 |
| COMPARATIVE EXAMPLE 1-3 | 1500 | 75 | 20 | 7.0 | 15 | 0.018 | 8900 |

In Examples 1-1 to 1-3, the hydrogen content of the diamond film 240 was adjusted in the range of not less than 1% nor more than 5% in atomic percent and the surface was polished so that the arithmetic mean roughness (Ra) of the surface became not more than 20 nm, whereby the preferred propagation loss and propagation speed (the propagation loss of not more than 0.02 dB/λ and the propagation speed of not less than 9000 m/s for the 2.5 GHz SAW) were successfully achieved. By applying such diamond substrates 200, it is feasible to realize the SAW devices that can be used in the high frequency band of 2.5 and higher GHz.

In Comparative Example 1-1, the hydrogen content was as small as 0.3%, and the surface acoustic wave was heavily scattered at grain boundaries, which posed the problem of increase of the propagation loss. In Comparative Example 1-2, the arithmetic mean roughness (Ra) of the surface was as large as 25 nm, and the surface acoustic wave was heavily scattered, which posed the problem of increase of the propagation loss. In Comparative Example 1-3, the hydrogen content was as large as 7%, and the decrease of hardness (decrease of elastic modulus) of the diamond film 240 posed the problem of decrease of the propagation speed.

Example 2

The diamond film 240 was deposited in the thickness of 20 μm on the silicon wafer 220 1.0 mm thick, by microwave CVD at the frequency of 2.45 GHz. The temperature of the silicon wafer 220 was controlled around 800° C.

The surface of the diamond film 240 was smoothed by polishing in much the same manner as in Example 1. Table 2 presents the deposition conditions of the diamond film 240.

The SAW device 100 was fabricated by applying the diamond substrate 200 in much the same manner as in Example 1.

Figure 3:
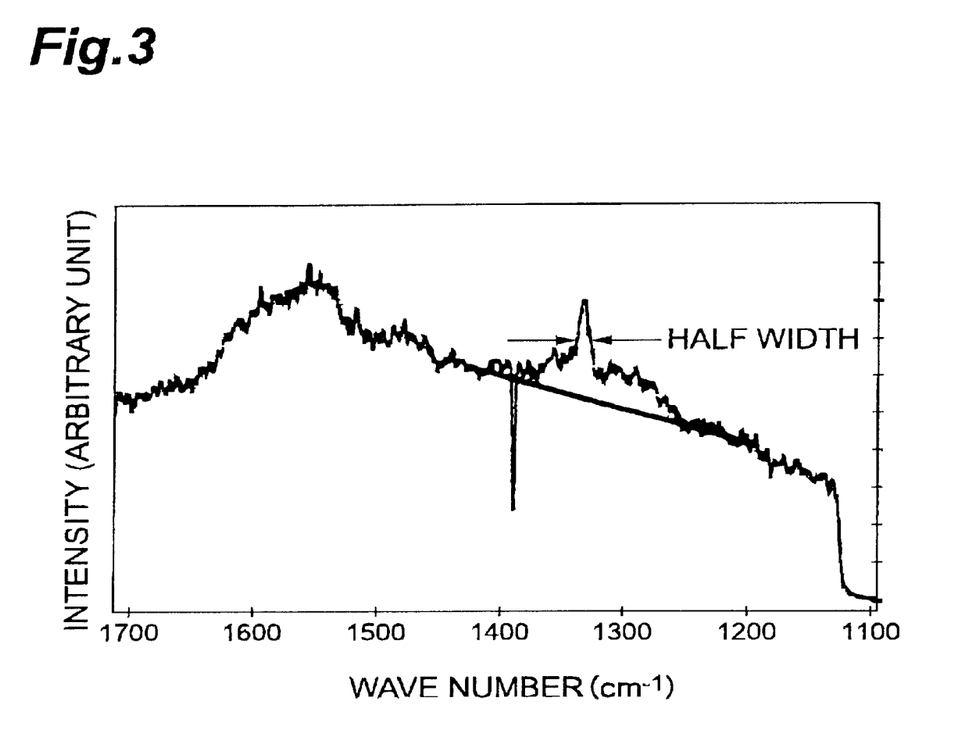
FIG. 3 is an example of a spectrum of a diamond film in Raman spectroscopy.

Table 2 provides the results of the hydrogen content of the diamond film 240, the arithmetic mean roughness (Ra) of the surface thereof, the half width of a peak in Raman spectroscopy, and the propagation loss and propagation speed of SAW for each of examples and comparative examples. FIG. 3 shows an example of a spectrum in the Raman spectroscopy of the diamond film. The peak near the wave number of 1333 cm$^{-1}$ shown an FIG. 3 is a peak of diamond. The peak has some width because of the Raman effect.

TABLE 2

| | H$_2$ FLOW sccm | CH$_4$ FLOW sccm | PRESSURE torr | HYDROGEN CONTENT at % | ARITHMETIC MEAN ROUGHNESS (Ra) nm | HALF WIDTH cm-1 | PROPAGATION LOSS db/λ | PROPAGATION SPEED m/s |
|---|---|---|---|---|---|---|---|---|
| EXAMPLE 2-1 | 1500 | 50 | 50 | 1.2 | 15 | 10 | 0.020 | 9900 |
| EXAMPLE 2-2 | 1500 | 55 | 50 | 2.3 | 17 | 14 | 0.019 | 9900 |
| EXAMPLE 2-3 | 1500 | 65 | 80 | 4.0 | 18 | 19 | 0.020 | 9880 |
| COMPARATIVE EXAMPLE 2-1 | 1500 | 30 | 50 | 0.3 | 20 | 5 | 0.035 | 9900 |
| COMPARATIVE EXAMPLE 2-2 | 1500 | 40 | 80 | 0.8 | 20 | 8 | 0.030 | 9900 |

In Examples 2-1 to 2-3, the crystallinity of the diamond film 240 was adjusted so that the half width of the peak became not less than 10 cm$^{-1}$, whereby the preferred propagation loss and propagation speed (the propagation loss of not more than 0.02 dB/λ and the propagation speed of not less than 9000 m/s for the 2.5 GHz SAW) were successfully achieved. By applying such diamond substrates 200, it is feasible to realize the SAW devices that can be used in the high frequency band of 2.5 and higher GHz.

In Comparative Examples 2-1 and 2-2, the half width of the peak was 5 cm$^{-1}$ or 8 cm$^{-1}$, respectively, and the SAW was heavily scattered, which posed the problem or increase of the propagation loss.

As the diamond film has a lower hydrogen content and better crystallinity, the half width of the peak in Raman spectroscopy decreases. In this case, the surface acoustic wave is scattered more at grain boundaries, so as to increase the propagation loss.

Inventor conducted elaborate research and found as a result that it was feasible to achieve the much preferred propagation loss of SAW when the diamond film had the peak near the wave number of 1333 cm$^{-1}$ in Raman spectroscopy and the half width of the peak was not less than 10 cm$^{-1}$.

Example 3

The diamond film 240 was formed in the thickness of 20 μm on the silicon wafer 220 0.8 mm thick, by filament CVD. A W wire was used as a filament. The temperature of the filament was controlled around 2100° C., and the temperature of the silicon wafer 220 around 800° C.

The surface of the diamond film 240 was smoothed by polishing in much the same manner as in Example 1. Table 3 presents the deposition conditions of the diamond film 240.

The SAW device 100 was fabricated by applying the diamond substrate 200 in much the same manner as in Example 1.

Table 3 provides the results of the hydrogen content of the diamond film 240, the arithmetic mean roughness (Ra) of the surface thereof, the hardness thereof, and the propagation loss and propagation speed of SAW for each of examples and comparative examples.

crystallinity of the diamond film becomes better, the surface acoustic wave is scattered more at grain boundaries, so as to increase the propagation loss.

Inventor conducted elaborate research and found that it was feasible to simultaneously realize the much preferred propagation speed and propagation loss of SAW when the Knoop hardness of the diamond film under the load of 500 g fell in the range of not less than 6000 kgf/mm$^2$ nor more than 8500 kgf/mm$^2$.

Example 4

The diamond film 240 was formed in the thickness of 20 $\mu$m on the silicon wafer 220 1.0 mm thick, by filament CVD.

TABLE 3

| | H$_2$ FLOW sccm | CH$_4$ FLOW sccm | PRESSURE torr | HYDROGEN CONTENT at % | ARITHMETIC MEAN ROUGHNESS (Ra) nm | HARDNESS kgf/mm$^2$ | PROPAGATION LOSS dB/$\lambda$ | PROPAGATION SPEED m/s |
|---|---|---|---|---|---|---|---|---|
| EXAMPLE 3-1 | 2000 | 70 | 30 | 4.5 | 13 | 6000 | 0.020 | 9200 |
| EXAMPLE 3-2 | 2000 | 60 | 40 | 3.2 | 16 | 7000 | 0.019 | 9500 |
| EXAMPLE 3-3 | 2000 | 55 | 50 | 1.3 | 18 | 8500 | 0.020 | 9750 |
| COMPARATIVE EXAMPLE 3-1 | 2000 | 80 | 80 | 7.3 | 19 | 5200 | 0.020 | 8800 |
| COMPARATIVE EXAMPLE 3-2 | 2000 | 40 | 40 | 0.8 | 20 | 9600 | 0.032 | 9950 |

In Examples 3-1 to 3-3, the hardness of the diamond film was adjusted so that the Knoop hardness of the diamond film 240 under the load of 500 g fell in the range of not less than 6000 kgf/mm$^2$ nor more than 8500 kgf/mm$^2$, whereby the preferred propagation loss and propagation speed (the propagation loss of not more than 0.02 dB/$\lambda$ and the propagation speed of not less than 9000 m/s for the 2.5 GHz SAW) were successfully achieved. By applying such diamond substrates 200, it is feasible to realize the SAW devices that can be used in the high frequency band of 2.5 and higher GHz.

In Comparative Example 3-1, the Knoop hardness under the load of 500 g was as small as 5200 kgf/mm$^2$ and the decrease of hardness (decrease of elastic modulus) of the diamond film 240 posed the problem of decrease of the propagation speed. In Comparative Example 3-2, the Knoop hardness under the load of 500 g was as large as 9600

A W wire was used as a filament. The temperature of the filament was controlled around 2100° C., and the temperature of the silicon wafer 220 around 800° C.

The surface of the diamond film 240 was smoothed by polishing in much the same manner as in Example 1. Table 4 presents the deposition conditions of the diamond film 240.

The SAW device 100 was fabricated by applying the diamond substrate 200 in much the same manner as in Example 1.

Figure 4:
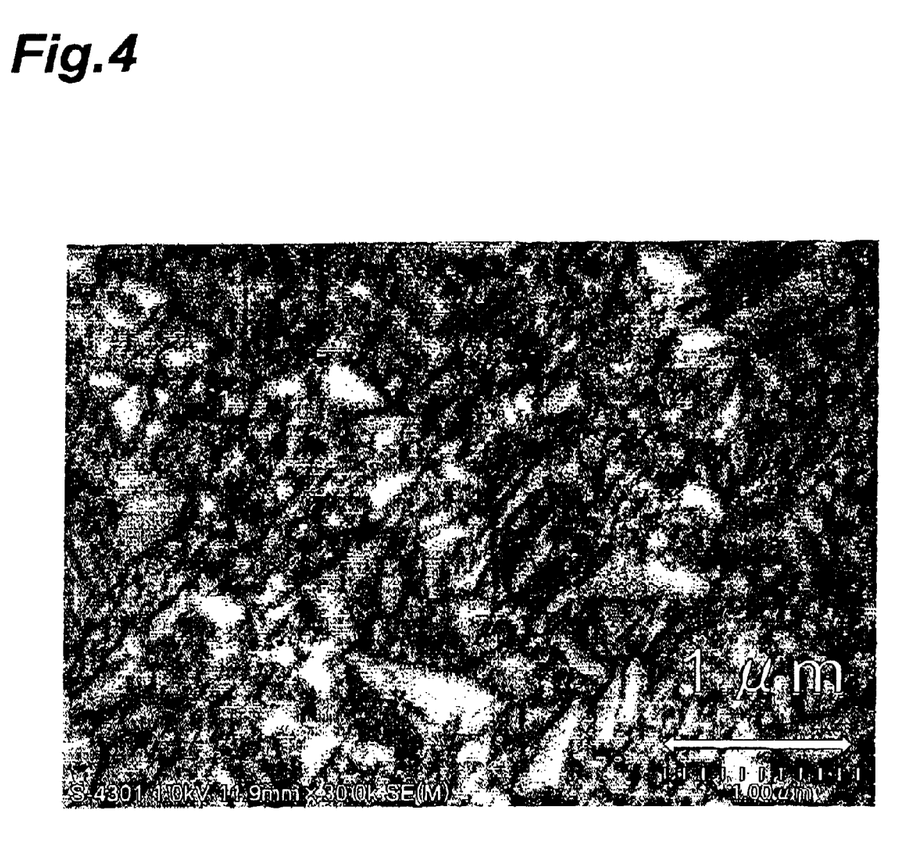
FIG. 4 is an example of observation of a diamond film with a scanning electron microscope (SEM).

Table 4 provides the results of the hydrogen content of diamond crystals in the diamond film 240, the arithmetic mean roughness (Ra) of the surface, the mean particle size, and the propagation loss and propagation speed of SAW for each of examples and comparative examples. The grain sizes of crystals were determined with a scanning electron microscope (SEM). FIG. 4 shows an example of observation of the diamond film with the scanning electron microscope (SEM).

TABLE 4

| | H$_2$ FLOW sccm | CH$_4$ FLOW sccm | PRESSURE torr | HYDROGEN CONTENT at % | ARITHMETIC MEAN ROUGHNESS (Ra) nm | MEAN PARTICLE SIZE $\mu$m | PROPAGATION LOSS dB/$\lambda$ | PROPAGATION SPEED m/s |
|---|---|---|---|---|---|---|---|---|
| EXAMPLE 4-1 | 1500 | 65 | 50 | 3.2 | 10 | 0.3 | 0.018 | 9800 |
| EXAMPLE 4-2 | 1500 | 60 | 50 | 2.8 | 13 | 0.5 | 0.020 | 9850 |
| EXAMPLE 4-3 | 1500 | 60 | 90 | 2.4 | 16 | 1.0 | 0.019 | 9880 |
| EXAMPLE 4-4 | 1500 | 60 | 90 | 2.4 | 16 | 1.5 | 0.020 | 9890 |
| COMPARATIVE EXAMPLE 4-1 | 1500 | 50 | 90 | 0.8 | 20 | 2.0 | 0.030 | 9900 |
| COMPARATIVE EXAMPLE 4-2 | 1500 | 45 | 90 | 0.2 | 22 | 3.0 | 0.035 | 9900 | kgf/mm$^2$ and the surface acoustic wave was heavily scattered at grain boundaries, which posed the problem of increase of the propagation loss.

As the hardness of the diamond film becomes lower, the propagation speed of SAW decreases. As the hardness of the diamond film becomes higher on the other hand, i.e., as the In Examples 4-1 to 4-3, the average particle size of diamond crystals in the diamond film 240 was adjusted to be not more than 1 $\mu$m, whereby the preferred propagation loss and propagation speed (the propagation loss of not more than 0.02 dB/$\lambda$ and the propagation speed of not less than 9000 m/s for the 2.5 GHz SAW) were successfully achieved.

By applying such diamond substrates 200, it is feasible to realize the SAW devices that can be used in the high frequency band of 2.5 and higher GHz In Comparative Example 4-1 and Comparative Example 4-2, the mean particle size of diamond crystals in the diamond film 240 was as large as 2.0 μm or 3.0 μm, respectively, and the surface acoustic wave became likely to be scattered, which posed the problem of increase of the propagation loss.

As the mean particle size of diamond crystals becomes larger, the surface acoustic wave becomes more likely to be scattered, so as to increase the propagation loss.

Inventor conducted elaborate research and found that it was feasible to realize the much preferred propagation loss of SAW when the mean particle size of diamond crystals in the diamond film was not more than 1 μm.

Example 5

The diamond film 240 was formed in the thickness of 30 μm on the silicon wafer 220 1.2 mm thick, by filament CVD. A W wire was used as a filament. The temperature of the filament was controlled around 2100° C., and the temperature of the silicon wafer 220 around 800° C. The flow rate of hydrogen was 1500 sccm, that of methane 60 sccm, and the pressure 40 Torr.

The diamond substrate 200 obtained as described above was fixed to the metal holder, and thereafter the diamond film 240 was smoothed by mechanical polishing with the grinding wheel including diamond abrasives. The grinding wheel used herein was one in which the mean diameter of abrasives was 20 μm. Table 5 presents the distance from the surface of the bond of the grinding wheel to the tip of the diamond abrasives, the maximum length of the flat regions at the distal ends of the abrasives, and the load during polishing. The polishing conditions were that the number of rotation of the grinding wheel was 200 rpm and the number of rotation of the holder 200 rpm.

The SAW device 400 was fabricated by applying the diamond substrate 200, as in Example 1.

Table 5 provides the results of the arithmetic mean roughness (Ra) of the surface of the diamond film 240 after smoothed by polishing, and the propagation loss and propagation speed of SAW for each of examples and a comparative example. In each of the examples and comparative example in Table 5, the hydrogen content of the diamond film 240 was 2.5 atomic %.

In Examples 5-1 to 5-3, the arithmetic mean roughness (Ra) of the surface of the diamond film 240 was adjusted to be not more than 10 nm, whereby the extremely preferred propagation loss (the propagation loss of about 0.018 dB/λ for the 2.5 GHz SAW) was successfully achieved based on decrease in scattering of SAW. By applying such diamond substrates 200, it is feasible to realize the SAW devices that can be used in the high frequency band of 2.5 and higher GHz.

In Comparative Example 5-1, the arithmetic mean roughness (Ra) of the surface of the diamond film 240 was as large as 26 nm and the surface acoustic wave was scattered more, so as to increase the propagation loss. In Example 5-4, the arithmetic mean roughness (Ra) of the surface of the diamond film 240 was as large as 14 nm and thus the effect of decreasing the propagation loss was relatively smaller.

Example 6

The diamond film 240 was formed in the thickness of 20 μm on the silicon wafer 220 0.8 mm thick, by filament CVD. A W wire was used as a filament. The temperature of the filament was controlled around 2100° C., and the temperature of the silicon wafer 220 around 800° C.

The diamond substrate 200 obtained as described above was fixed to the metal holder, and thereafter the diamond film 240 was smoothed by mechanical polishing with the grinding wheel including the diamond abrasives. The grinding wheel used herein was one in which the average diameter of abrasives was 20 μm, the distance was 2 μm between the surface of the bond and the tip of the diamond abrasives, and the maximum length of flat regions at the distal end of the abrasives was 6 μm. The polishing conditions were that the number of rotation of the grinding wheel was 200 rpm, the number of rotation of the holder was 200 rpm, and the load was 3 kg. Table 6 presents the deposition conditions of the diamond film 240.

A ZnO film (piezoelectric film 120) was then deposited in the thickness of 500 nm on the diamond film 240 after polished, by RF sputtering An Al film was then formed in the thickness of 80 nm on the ZnO film by DC sputtering. Unnecessary portions were removed from the Al film by photolithography to form the interdigital transducers 140 and 160. The electrode width of the interdigital transducers 140 and 160 was 0.5 μm, the electrode cross width 50 times the wavelength λ, and the number of electrode digit pairs 40.

The characteristics of the SAW device 100 were evaluated by a network analyzer. Table 6 provides the results of the hydrogen content of the diamond film 240, the arithmetic mean roughness (Ra) of the surface thereof, and the propagation loss and propagation speed of SAW for each of examples and comparative examples.

TABLE 5

| | DISTANCE TO TIP OF ABRASIVE μm | MAX LENGTH OF FLAT REGION μm | LOAD kg | ARITHMETIC MEAN ROUGHNESS (Ra) nm | PROPAGATION LOSS dB/λ | PROPAGATION SPEED m/s |
|---|---|---|---|---|---|---|
| EXAMPLE 5-1 | 2 | 7 | 4 | 3 | 0.017 | 9850 |
| EXAMPLE 5-2 | 3 | 6 | 4 | 5 | 0.018 | 9850 |
| EXAMPLE 5-3 | 4 | 5 | 4 | 10 | 0.018 | 9850 |
| EXAMPLE 5-4 | 7 | 3 | 4 | 14 | 0.020 | 9850 |
| COMPARATIVE EXAMPLE 5-1 | 7 | 3 | 8 | 26 | 0.038 | 9850 |

TABLE 6

| | H₂ FLOW sccm | CH₄ FLOW sccm | PRESSURE torr | HYDROGEN CONTENT at % | ARITHMETIC MEAN ROUGHNESS (Ra) nm | PROPAGATION LOSS dB/λ | PROPAGATION SPEED m/s |
|---|---|---|---|---|---|---|---|
| EXAMPLE 6-1 | 2000 | 60 | 20 | 1.0 | 20 | 0.050 | 9800 |
| EXAMPLE 6-2 | 2000 | 70 | 30 | 3.0 | 13 | 0.047 | 9500 |
| EXAMPLE 6-3 | 2000 | 80 | 30 | 5.0 | 8 | 0.045 | 9200 |
| COMPARATIVE EXAMPLE 6-1 | 2000 | 50 | 50 | 0.3 | 20 | 0.065 | 9900 |
| COMPARATIVE EXAMPLE 6-2 | 2000 | 65 | 30 | 1.2 | 24 | 0.070 | 9900 |
| COMPARATIVE EXAMPLE 6-3 | 2000 | 95 | 20 | 7.0 | 15 | 0.050 | 8900 |

In Examples 6-1 to 6-3, the hydrogen content of the diamond film 240 was adjusted in the range of not less than 1% nor more than 5% in atomic percent and the surface was polished so that the arithmetic mean roughness (Ra) of the surface became not more than 20 nm, whereby the preferred propagation loss and propagation speed (the propagation loss of not more than 0.05 dB/λ and the propagation speed of not less than 9000 m/s for the 5 GHz SAW) were successfully achieved. By applying such diamond substrates 200, it is feasible to realize the SAW devices that can be used in the high frequency band of 5 and higher GHz.

In Comparative Example 6-1, the hydrogen content was as small as 0.3%, and the surface acoustic wave was heavily scattered at grain boundaries, which posed the problem of increase of the propagation loss. In Comparative Example 6-2, the arithmetic mean roughness (Ra) of the surface was as large as 24 nm, and the surface acoustic wave was largely scattered, which posed the problem of increase of the propagation loss. In Comparative Example 6-3, the hydrogen content was as large as 7%, and the decrease of hardness (decrease of elastic modulus) of the diamond film 240 posed the problem of decrease of the propagation speed.

(Second Embodiment)

The SAW device 100 is composed of a diamond substrate 200 of the present embodiment, a piezoelectric film 120 formed on the diamond substrate 200 (an intermediate layer may also be formed between the diamond substrate 200 and the piezoelectric film 120), and an interdigital transducer 140 and an interdigital transducer 160 formed on the piezoelectric film 120. The diamond substrate 200 is comprised of a silicon wafer 220 and a diamond film 240. The SAW device of the present invention may also be fabricated in such a way that the interdigital transducers are first formed on the diamond substrate and then the piezoelectric film is further formed on the diamond substrate.

Figure 5:
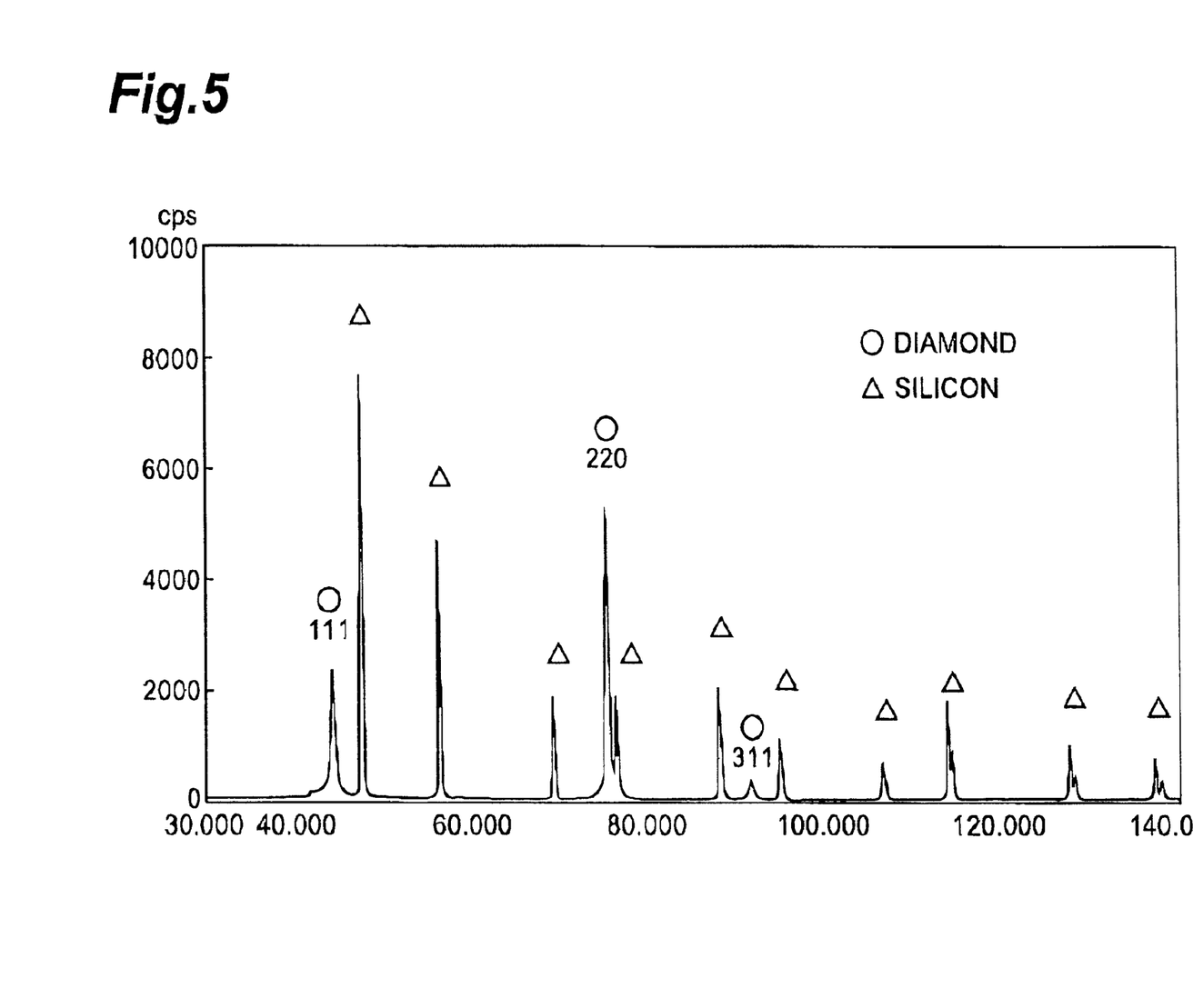
FIG. 5 is an example of an X-ray diffraction chart of a diamond substrate.

The diamond film 240 is formed on the surface of the silicon wafer 220 by CVD (chemical vapor deposition), hot-filament CVD, microwave plasma CVD, high-frequency plasma CVD, the DC plasma jet method, or the like. During the deposition of the film, the hydrogen content of the diamond film 240 is adjusted in the range of not less than 1% nor more than 5% in atomic percent, and the ratio $I_{(220)}/I_T$ of the peak intensity $I_{(220)}$ of the diamond crystal plane (220) to the total $I_T$ of the peak intensities of the diamond crystal planes (111), (220), (311), (400), and (331) in X-ray diffraction analysis is also adjusted so as to be not less than 0.8. FIG. 5 shows an example of an X-ray diffraction chart of the diamond substrate. In this example, $I_{(220)}/I_T$ is 0.66, which is outside the range of the present embodiment.

The surface of the diamond film 240 thus deposited is smoothed by polishing so that the arithmetic mean roughness (Ra) thereof becomes not more than 20 nm (more preferably, not more than 10 nm). The polishing can be mechanical polishing with the grinding stone including abrasive grains of diamond. The smoothing by polishing may be replaced by the method of micronizing grain sizes of crystals into the nanometer order during the deposition of the diamond film 240 so that the arithmetic mean roughness (Ra) becomes not more than 20 nm (more preferably, not more than 10 nm). In order to decrease the roughness of the surface by polishing, the grinding wheel is preferably one in which the distance is small between the surface of the bond and the flat surfaces at the tip of the diamond abrasives and in which the diamond abrasives have large areas of the flat surfaces at the tip of the diamond abrasives.

The material of the substrate for the diamond film 240 to be formed thereon is not limited to silicon, but can be one of ceramics and metals such as $Si_3N_4$, Mo, etc., in addition to GaAs, SiC, AlN, InP, GaN, and so on. The material can also be cemented carbide or cermet, depending upon applications.

Preferably, the diamond film 240 satisfies the following conditions (1) to (3).

(1) The spectrum by Raman spectroscopy using the Ar laser of the wavelength of 514.5 nm has a peak near the wave number of 1333 $cm^{-1}$ and the peak has the half width of not less than 10 $cm^{-1}$.

(2) The Knoop hardness measured under the load of 500 g falls in the range of not less than 6000 $kgf/mm^2$ nor more than 8500 $kgf/mm^2$.

(3) The average grain size of diamond crystals is not more than 1 μm.

The piezoelectric film 120 is formed on the surface of the diamond substrate 200 formed as described above, by CVD, microwave plasma CVD, PVD (physical vapor deposition), sputtering, ion plating, laser ablation, or the like. The piezoelectric can be one selected from AlN, ZnO, $LiNbO_3$, $LiTaO_3$, $KNbO_3$, PZT ($PbZr_xTi_{(1-x)}O_3$), and so on.

The interdigital transducers 140 and 160 are formed on the surface of the piezoelectric film 120. The interdigital transducer 140 has an input terminal 142 and an input terminal 144, while the interdigital transducer 160 has an output terminal 162 and an output terminal 164.

The diamond substrate 200 of the present embodiment achieves the high propagation speed of the second-order Sezawa wave of 9000 m/s, because the hydrogen content of the diamond film 240 is not more than 5% in atomic percent. The diamond substrate 200 demonstrates the propagation loss of not more than 0.022 dB/λ in application to the 2.5 GHz SAW device, because the hydrogen content of the diamond film 240 is not less than 1% in atomic percent; and the diamond substrate 200 has the Q value of not less than 700, because the intensity ratio ($I_{(220)}/I_T$) of the plane (220) is not less than 0.8. Such high propagation speed, small propagation loss, and large Q value were first substantiated simultaneously by the present invention, and this diamond substrate made it feasible to realize the SAW devices ready for high frequencies with low loss and with excellent frequency characteristics.

The insertion loss of the SAW device includes the resistance loss at the electrodes, the loss due to bi-directional spread of SAW, the loss due to reflection at the electrodes, the propagation loss, etc., and the present invention decreases the insertion loss of SAW on the basis of the decrease of propagation loss of the diamond substrate.

The SAW devices were fabricated with different distances between the input and output electrodes (the SAW devices with the respective distances between the input and output electrodes equivalent to 50 waves, 100 waves, and 150 waves), and were evaluated as to the relation between insertion loss and propagation distance (the distance between the input and output electrodes). A linear relation was obtained between them. A propagation loss per wave was obtained from the slope of the straight line. Also, Inventors calculated the analyzed propagation loss based on the actual insertion loss measured at frequency between 2.3–2.6 GHz. The analyzed propagation loss 0.022 dB/$\lambda$ is equivalent to the actual propagation loss at frequency 2.5 GHz 0.02 dB/$\lambda$. Hereinafter in the second embodiment, the "propagation loss" is represented by the analyzed propagation loss.

EXAMPLES

The present invention will be described below in further detail with examples and comparative examples.

Example 7

The diamond film 240 was formed in the thickness of 20 $\mu$m on the silicon wafer 220 0.8 mm thick, by filament CVD. A W wire was used as a filament. The temperature of the filament was controlled approximately in the range of 2100 to 2200° C., and the temperature of the silicon wafer 220 approximately in the range of 700 to 800° C. Source gases were hydrogen and methane. The flow rate of hydrogen gas was determined in the range of 500 to 5000 sccm, and the percent of the flow rate of methane gas to the flow rate of hydrogen gas in the range of 0.5 to 5.0%. The pressure of gas was determined in the range of 5 to 120 Torr.

The diamond substrate 200 obtained as described above was fixed to the metal holder, and thereafter the diamond film 240 was smoothed by mechanical polishing with the grinding wheel including the diamond abrasives. The grinding wheel used herein was one in which the average diameter of diamond abrasives was 20 $\mu$m, the distance was 2 $\mu$m between the surface of the bond and the flat surfaces at the tip of the diamond abrasives, and the maximum length of the flat surfaces at the tip of the diamond abrasives was 6 $\mu$m. The polishing conditions were that the number of rotation of the grinding wheel was 200 rpm, the number of rotation of the holder was 200 rpm, and the load was 4 kg.

A ZnO film (piezoelectric film 120) was then deposited in the thickness of 500 nm on the diamond film 240 after polished, by RF sputtering.

An Al film was then formed in the thickness of 80 nm on the ZnO film by DC sputtering. Unnecessary portions were removed from the Al film by photolithography to form the interdigital transducers 140 and 160. On the assumption that the wavelength of SAW $\lambda$=4 $\mu$m, the interdigital transducers were constructed in the structure wherein the electrode width of the interdigital transducers 140 and 160 was 1 $\mu$m, the electrode cross width 50 times the wavelength $\lambda$, and the number of electrode digit pairs 40.

Table 7 provides the results of the intensity ratio of the plane (220) of the diamond film 240, the hydrogen content (atomic percent), the arithmetic mean roughness (Ra) of the surface thereof, the propagation loss and propagation speed of SAW, and the Q value for each of examples and comparative examples. The hydrogen contents were determined by the method reported in JAPANESE JOURNAL OF APPLIED PHYSICS, VOL 23, No. 7, PP810–814, from absorption peaks of $CH_n$ near 3000 $cm^{-1}$ in infrared absorption analysis. The arithmetic mean roughness (Ra) of the surface was determined by means of the atomic force microscope (AFM).

TABLE 7

|  | (220) INTENSITY RATIO | HYDROGEN CONTENT at % | ARITHMETIC MEAN ROUGHNESS (Ra) nm | PROPAGATION LOSS dB/$\lambda$ | PROPAGATION SPEED m/s | Q VALUE |
|---|---|---|---|---|---|---|
| EXAMPLE 7-1 | 0.93 | 1.0 | 10 | 0.021 | 9900 | 780 |
| EXAMPLE 7-2 | 0.87 | 2.5 | 12 | 0.020 | 9810 | 730 |
| EXAMPLE 7-3 | 0.80 | 3.8 | 10 | 0.021 | 9660 | 700 |
| EXAMPLE 7-4 | 0.82 | 5.0 | 18 | 0.020 | 9420 | 720 |
| EXAMPLE 7-5 | 0.92 | 3.1 | 20 | 0.020 | 9700 | 760 |
| EXAMPLE 7-6 | 0.75 | 4.2 | 14 | 0.021 | 9600 | 670 |
| EXAMPLE 7-7 | 0.71 | 4.4 | 18 | 0.022 | 9580 | 650 |
| COMPARATIVE EXAMPLE 7-1 | 0.92 | 0.3 | 18 | 0.030 | 9900 | 680 |
| COMPARATIVE EXAMPLE 7-2 | 0.85 | 3.3 | 25 | 0.036 | 9710 | 600 |
| COMPARATIVE EXAMPLE 7-3 | 0.81 | 6.8 | 18 | 0.022 | 8900 | 710 |

In Examples 7-1 to 7-5, the intensity ratio of (220) of the diamond film 240 was adjusted in the range of not less than 0.80, the hydrogen content was adjusted in the range of not less than 1% nor more than 5% in atomic percent, and the surface was polished so as to have the arithmetic mean roughness (Ra) of not more than 20 nm, whereby the preferred propagation loss, propagation speed, and Q value (the propagation loss of not more than 0.022 dB/$\lambda$ and the propagation speed of the second-order Sezawa wave of not less than 9000 m/s for the 2.5 GHz SAW, and the Q value of not less than 700) were successfully achieved. By applying such diamond substrates 200, it is feasible to realize the SAW devices with small insertion loss and with excellent frequency characteristics that can be used even in the high frequency band of 2.5 and higher GHz.

In Examples 7-6 and 7-7, the (220) intensity ratio was as small as 0.75 or 0.71, respectively, so that the Q value was small, but the propagation loss and propagation speed were satisfactory. In Comparative Example 7-1, the hydrogen content was as low as 0.3%, and the surface acoustic wave was heavily scattered at grain boundaries, which posed the problem of increase of the propagation loss. In Comparative Example 7-2, the arithmetic mean roughness (Ra) of the surface was as large as 25 nm, so that the surface acoustic wave was heavily scattered, so as to pose the problem of increase of the propagation loss. In comparative Example 7-3, the hydrogen content was as large as 6.8%, and the decrease of hardness (decrease of elastic modulus) of the diamond film 240 posed the problem of decrease of the propagation speed.

The surface of the diamond film 240 was smoothed by polishing in much the same manner as in Example 7. The SAW device 100 was fabricated by applying the diamond substrate 200 in much the same manner as in Example 7.

Table 8 provides the results of the (220) intensity ratio of the diamond film 240, the hydrogen content, the arithmetic mean roughness (Ra) of the surface, the half width of the peak in Raman spectroscopy, the propagation loss and propagation speed of SAW, and the Q value for each of examples and comparative examples. FIG. 3 shows an example of the spectrum in Raman spectroscopy of the diamond film. The peak near the wave number of 1333 cm$^{-1}$ shown in FIG. 3 is a peak of diamond. The peak has some width because of the Raman effect.

TABLE 8

| | (220) INTENSITY RATIO | HYDROGEN CONTENT at % | ARITHMETIC MEAN ROUGHNESS (Ra) nm | HALF WIDTH cm$^{-1}$ | PROPAGATION LOSS dB/λ | PROPAGATION SPEED m/s | Q VALUE |
|---|---|---|---|---|---|---|---|
| EXAMPLE 8-1 | 0.92 | 2.0 | 17 | 10 | 0.021 | 9900 | 760 |
| EXAMPLE 8-2 | 0.86 | 2.5 | 12 | 16 | 0.020 | 9860 | 730 |
| EXAMPLE 8-3 | 0.83 | 3.8 | 5 | 22 | 0.021 | 9710 | 720 |
| EXAMPLE 8-4 | 0.81 | 1.2 | 10 | 9 | 0.022 | 9880 | 700 |
| COMPARATIVE EXAMPLE 8-1 | 0.93 | 0.4 | 18 | 5 | 0.035 | 9890 | 630 |
| COMPARATIVE EXAMPLE 8-2 | 0.90 | 0.8 | 15 | 8 | 0.031 | 9900 | 650 |

In order to increase the Q value, it is conceivable to make improvement in design of the SAW device, for example, by increasing the number of electrode digit pairs of the interdigital transducers, but in that case, there will arise another problem that the insertion loss of the SAW device increases. It is thus desirable to restrict the construction conditions of the diamond film so as to increase the Q value, whereby the large Q value is achieved while maintaining the preferred propagation speed and propagation loss of SAW.

Inventor conducted elaborate research and found that it was feasible to simultaneously realize the preferred propagation speed and propagation loss of SAW under the conditions that the hydrogen content of the diamond film fell in the range of not less than 1% nor more than 5% in atomic percent and the arithmetic mean roughness (Ra) of the surface of the diamond film was not more than 20 nm. Furthermore, Inventor also found that the Q value was increased to the preferred level with the preferred propagation speed and propagation loss of SAW being maintaining, when the ratio $I_{(220)}/I_T$ of the peak intensity $I_{(220)}$ of the diamond crystal plane (220) to the total $I_T$ of the peak intensities of the diamond crystal planes (111), (220), (311), (400), and (331) in X-ray diffraction analysis of the diamond film, was not less than 0.8.

Example 8

The diamond film 240 was formed in the thickness of 20 μm on the silicon wafer 220 1.0 mm thick, by microwave CVD at the frequency of 2.45 GHz. The temperature of the silicon wafer 220 was controlled approximately in the range of 700 to 800° C. Source gases were hydrogen and methane. The flow rate of hydrogen gas was determined in the range of 500 to 5000 sccm, and the percent of the flow rate of methane gas to the flow rate of hydrogen gas in the range of 0.5 to 5.0%. The pressure of gas was determined in the range of 5 to 120 Torr.

In Examples 8-1 to 8-3, the crystallinity of the diamond film 240 was adjusted so that the half width of the peak became not less than 10 cm$^{-1}$, whereby the preferred propagation loss, propagation speed, and Q value (the propagation loss of not more than 0.022 dB/λ and the propagation speed of the second-order Sezawa wave of not less than 9000 m/s for the 2.5 GHz SAW, and the Q value of not less than 700) were successfully achieved. By applying such diamond substrates 200, it is feasible to realize the SAW devices with small insertion loss and with excellent frequency characteristics that can be used even in the high frequency band of 2.5 and higher GHz.

In Comparative Examples 8-1 and 8-2, the half width of the peak was as small as 5 cm$^{-1}$ or 8 cm$^{-1}$, respectively, so that the surface acoustic wave was heavily scattered, so as to pose the problem of increase of the propagation loss. In Example 8-4, the substrate demonstrated the preferred values of the (220) intensity ratio, hydrogen content, and surface roughness (Ra) but had the small half width of 9 cm$^{-1}$, so that the effect of decreasing the propagation loss was relatively smaller.

Example 9

The diamond film 240 was formed in the thickness of 20 μm on the silicon wafer 220 0.8 mm thick, by filament CVD. A W wire was used as a filament. The temperature of the filament was controlled approximately in the range of 2100 to 2200° C., and the temperature of the silicon wafer 220 approximately in the range of 700 to 800° C. Source gases were hydrogen and methane. The flow rate of hydrogen gas was determined in the range of 500 to 5000 sccm, and the percent of the flow rate of methane gas to the flow rate of hydrogen gas in the range of 0.5 to 5.0%. The pressure of gas was determined in the range of 5 to 120 Torr.

The surface of the diamond film 240 was smoothed by polishing in much the same manner as in Example 7. The SAW device 100 was fabricated by applying the diamond substrate 200 in much the same manner as in Example 7.

Table 9 provides the results of the (220) intensity ratio of the diamond film 240, the hydrogen content, the arithmetic mean roughness (Ra) of the surface, the hardness (the Knoop hardness measured under the load of 500 g), the propagation loss and propagation speed of SAW, and the Q value for each of examples and comparative examples.

Therefore, the substrate of Example 9-5 exhibited the relatively smaller effect of decreasing the propagation loss.

TABLE 9

| | (220) INTENSITY RATIO | HYDROGEN CONTENT at % | ARITHMETIC MEAN ROUGHNESS (Ra) nm | HARDNESS Kgf/mm$^2$ | PROPAGATION LOSS dB/$\lambda$ | PROPAGATION SPEED m/s | Q VALUE |
|---|---|---|---|---|---|---|---|
| EXAMPLE 9-1 | 0.82 | 4.5 | 11 | 6000 | 0.020 | 9400 | 710 |
| EXAMPLE 9-2 | 0.86 | 3.3 | 13 | 7200 | 0.021 | 9620 | 730 |
| EXAMPLE 9-3 | 0.94 | 1.3 | 16 | 8500 | 0.021 | 9880 | 750 |
| EXAMPLE 9-4 | 0.81 | 4.8 | 18 | 5500 | 0.022 | 9000 | 710 |
| EXAMPLE 9-5 | 0.93 | 1.1 | 11 | 8700 | 0.022 | 9900 | 740 |
| COMPARATIVE EXAMPLE 9-1 | 0.80 | 6.5 | 18 | 5300 | 0.022 | 8850 | 660 |
| COMPARATIVE EXAMPLE 9-2 | 0.93 | 0.8 | 20 | 9400 | 0.032 | 9920 | 610 |

In Examples 9-1 to 9-3, the diamond film 240 was adjusted so that the Knoop hardness thereof measured under the load of 500 g fell in the range of not less than 6000 kgf/mm$^2$ nor more than 8500 kgf/mm$^2$, whereby the preferred propagation loss, propagation speed, and Q value (the propagation loss of not more than 0.022 dB/$\lambda$ and the propagation speed of the second-order Sezawa wave of not less than 9000 m/s for the 2.5 GHz SAW, and the Q value of not less than 700) were successfully achieved. By applying such diamond substrates 200, it is feasible to realize the SAW devices with small insertion loss and with excellent frequency characteristics that can be used even in the high frequency band of 2.5 and higher GHz.

In Comparative Example 9-1, the Knoop hardness under the load of 500 g was as small as 5300 kgf/mm$^2$, and there arose the problem of decrease of the propagation speed. In Comparative Example 9-2, the Knoop hardness under the load of 500 g was as large as 9400 kgf/mm$^2$, and the surface acoustic wave was heavily scattered at grain boundaries, so as to pose the problem of increase of the propagation loss. In Example 9-4, the substrate demonstrated the preferred values of the (220) intensity ratio, hydrogen content, and surface roughness (Ra) but had the small Knoop hardness of 5500 kgf/mm$^2$ under the load of 500 g, so that the effect of increasing the propagation speed was relatively smaller. In Example 9-5, the substrate demonstrated the preferred values of the (220) intensity ratio, hydrogen content, and surface roughness (Ra) but had the large Knoop hardness of 8700 kgf/mm$^2$ under the load of 500 g, though the surface was flatly polished to the surface roughness (Ra) of 11.

Example 10

The diamond film 240 was formed in the thickness of 20 $\mu$m on the silicon wafer 220 1.0 mm thick, by filament CVD. A W wire was used as a filament. The temperature of the filament was controlled approximately in the range of 2100 to 2200° C., and the temperature of the silicon wafer 220 approximately in the range of 700 to 800° C. Source gases were hydrogen and methane. The flow rate of hydrogen gas was determined in the range of 500 to 5000 sccm, and the percent of the flow rate of methane gas to the flow rate of hydrogen gas in the range of 0.5 to 5.0%. The pressure of gas was determined in the range of 5 to 120 Torr.

The surface of the diamond film 240 was smoothed by polishing in much the same manner as in Example 7. The SAW device 100 was fabricated by applying the diamond substrate 200 in much the same manner as in Example 7.

Table 10 provides the results of the (220) intensity ratio of the diamond film 240, the hydrogen content, the arithmetic mean roughness (Ra) of the surface, the mean particle size of diamond crystals, the propagation loss and propagation speed of SAW, and the Q value for each of examples and comparative examples. The grain sizes of crystals were measured by means of the scanning electron microscope (SEM). FIG. 4 shows the example of observation of the diamond film with the scanning electron microscope (SEM).

TABLE 10

| | (220) INTENSITY RATIO | HYDROGEN CONTENT at % | ARITHMETIC MEAN ROUGHNESS (Ra) nm | MEAN PARTICLE SIZE $\mu$m | PROPAGATION LOSS dB/$\lambda$ | PROPAGATION SPEED m/s | Q VALUE |
|---|---|---|---|---|---|---|---|
| EXAMPLE 10-1 | 0.83 | 4.1 | 10 | 0.1 | 0.019 | 9780 | 760 |
| EXAMPLE 10-2 | 0.85 | 3.2 | 13 | 0.1 | 0.022 | 9820 | 730 |
| EXAMPLE 10-3 | 0.91 | 2.2 | 16 | 1.0 | 0.022 | 9900 | 710 |
| EXAMPLE 10-4 | 0.82 | 4.0 | 9 | 2.0 | 0.022 | 9800 | 710 |
| COMPARATIVE EXAMPLE 11-1 | 0.90 | 0.8 | 20 | 2.0 | 0.030 | 9900 | 630 |
| COMPARATIVE EXAMPLE 11-2 | 0.92 | 0.6 | 22 | 3.0 | 0.035 | 9900 | 650 |

In Examples 10-1 to 10-3, the diamond film 240 was adjusted so that the mean particle size of diamond crystals therein became not more than 1 $\mu$m, whereby the preferred propagation loss, propagation speed, and Q value (the propagation loss of not more than 0.022 dB/$\lambda$ and the propagation speed of the second-order Sezawa wave of not less than 9000 m/s for the 2.5 GHz SAW, and the Q value of not less than 700) were successfully achieved. By applying such diamond substrates 200, it is feasible to realize the SAW devices with small insertion loss and with excellent frequency characteristics that can be used even in the high frequency band of 2.5 and higher GHz.

In Comparative Examples 10-1 and 10-2, the mean particle size of diamond crystals in the diamond film 240 was as large as 2.0 μm or 3.0 μm, respectively, and the surface acoustic wave became likely to be scattered, so as to pose the problem of increase of the propagation loss. In Example 10-4, the substrate demonstrated the preferred values of the (220) intensity ratio, hydrogen content, and surface roughness (Ra), but had the large mean particle size of diamond crystals of 2.0 μm in the diamond film 240, so that the effect of decreasing the propagation loss was relatively smaller.

Example 11

The diamond film 240 was formed in the thickness of 30 μm on the silicon wafer 220 1.2 mm thick, by filament CVD. A W wire was used as a filament. The temperature of the filament was controlled approximately in the range of 2100 to 2200° C., and the temperature of the silicon wafer 220 approximately in the range of 700 to 800° C. Source gases were hydrogen and methane. The flow rate of hydrogen gas was 1500 sccm and the flow rate of methane gas 60 sccm. The pressure of gas was 20 Torr.

The above resulted in obtaining the diamond substrate 200 having the hydrogen content of 3.2% in atomic percent and the (220) intensity ratio of 0.88. The diamond substrate 200 was fixed to the metal holder and thereafter the diamond film 240 was smoothed by mechanical polishing with the grinding wheel including the diamond abrasives in the average diameter of 30 μm. Table 11 presents the distance between the surface of the bond and the flat surfaces at the tip of the diamond abrasives in the grinding wheel, the maximum length of the flat surfaces at the tip of the diamond abrasives, and the load during the polishing. The polishing conditions were that the number of rotation of the grinding wheel was 200 rpm and the number of rotation of the holder 200 rpm.

The SAW device 100 was fabricated by applying the diamond substrate 200 in much the same manner as in Example 7.

Table 11 provides the results of the arithmetic mean roughness (Ra) of the surface of the diamond film 240, the propagation loss and propagation speed of SAW, and the Q value for each of examples and a comparative example.

of about 0.019 dB/λ for the 2.5 GHz SAW) was successfully achieved based on decrease in scattering of SAW. By applying such diamond substrates 200, it is feasible to realize the SAW devices with small insertion loss and excellent frequency characteristics that can be used even in the high frequency band of 2.5 and higher GHz.

In Comparative Example 11-1, the arithmetic mean roughness (Ra) of the surface of the diamond film 240 was as large as 26 nm and the surface acoustic wave was scattered more, so as to increase the propagation loss. In Example 11-4, the arithmetic mean roughness (Ra) of the surface of the diamond film 240 was as large as 15 nm and thus the effect of decreasing the propagation loss was relatively smaller.

What is claimed is:

1. A diamond substrate for surface acoustic wave device, comprising a substrate, and a diamond film formed on the substrate,
    wherein a hydrogen content of said diamond film is in the range of not less than 1% nor more than 5% in atomic percent,
    wherein an arithmetic mean roughness (Ra) of a surface of said diamond film is not more than 20 nm, and
    wherein a ratio $I_{(220)}/I_T$, which is a ratio of a peak intensity $I_{(220)}$ of the diamond crystal plane (220) to the total $I_T$ of peak intensities of the diamond crystal planes (111), (220), (311), (400), and (331) in X-ray diffraction analysis of said diamond film, is not less than 0.8.

2. The diamond substrate according to claim 1, wherein said diamond film has a peak near the wave number of 1333 cm$^{-1}$ in Raman spectroscopy and a half width of said peak is not less than 10 cm$^{-1}$.

3. The diamond substrate according to claim 1, wherein a Knoop hardness of said diamond film measured under a load of 500 g is in the range of not less than 6000 kgf/mm$^2$ nor more than 8500 kgf/mm$^2$.

4. The diamond substrate according to claim 1, wherein a mean particle size of diamond crystals in said diamond film is not more than 1 μm.

5. The diamond substrate according to claim 1, wherein the arithmetic mean roughness (Ra) of the surface of said diamond film is not more than 10 nm.

6. A surface acoustic wave device in which a piezoelectric film is formed on the diamond substrate according to claim 1 and in which interdigital transducers are formed on said piezoelectric film.

7. The surface acoustic wave device according to claim 6, wherein a propagation loss of the second-order Sezawa wave of 2.5 GHz propagating in said diamond film is not more than 0.02 dB/λ and a propagation speed thereof is not less than 9000 m/s.

TABLE 11

| | DISTANCE TO FLAT SURFACE AT TIP μm | MAX LENGTH OF FLAT SURFACE AT TIP μm | LOAD kg | ARITHMETIC MEAN ROUGHNESS (Ra) nm | PROPAGATION LOSS dB/λ | PROPAGATION SPEED m/s | Q VALUE |
|---|---|---|---|---|---|---|---|
| EXAMPLE 11-1 | 3 | 11 | 4 | 2 | 0.018 | 9840 | 740 |
| EXAMPLE 11-2 | 4 | 9 | 4 | 5 | 0.019 | 9840 | 730 |
| EXAMPLE 11-3 | 6 | 8 | 4 | 10 | 0.020 | 9840 | 730 |
| EXAMPLE 11-4 | 11 | 5 | 4 | 15 | 0.022 | 9840 | 700 |
| COMPARATIVE EXAMPLE 11-1 | 11 | 5 | 9 | 26 | 0.039 | 9840 | 590 |

In Examples 11-1 to 11-3, the diamond film 240 was adjusted so that the arithmetic mean roughness (Ra) of the surface thereof became not more than 10 nm, whereby the extremely preferred propagation loss (the propagation loss 8. A diamond substrate for surface acoustic wave device, comprising a substrate, and a diamond film formed on the substrate, wherein a hydrogen content of said diamond film is in the range of not less than 1% nor more than 5% in atomic percent, wherein an arithmetic mean roughness (Ra) of a surface of said diamond film is not more than 20 nm, and wherein said diamond film has a peak near the wave number of 1333 cm$^{-1}$ in Raman spectroscopy and a half width of said peak is not less than 10 cm$^{-1}$.

9. A surface acoustic wave device in which a piezoelectric film is formed on the diamond substrate according to claim 8 and in which interdigital transducers are formed on said piezoelectric film.

10. The surface acoustic wave device according to claim 9, wherein a propagation loss of the second-order Sezawa wave of 2.5 GHz propagating in said diamond film is not more than 0.02 dB/ and a propagation speed thereof is not less than 9000 m/s.

* * * * *